US008872615B2

(12) United States Patent
Kennedy et al.

(10) Patent No.: US 8,872,615 B2
(45) Date of Patent: Oct. 28, 2014

(54) MAGNETIC NANOCLUSTERS

(75) Inventors: John Vedamuthu Kennedy, Lower Hutt (NZ); Andreas Markwitz, Lower Hutt (NZ)

(73) Assignee: Institute of Geological and Nuclear Sciences Limited, Lower Hutt (NZ)

( * ) Notice: Subject to any disclaimer, the term of this patent is extended or adjusted under 35 U.S.C. 154(b) by 0 days.

(21) Appl. No.: 13/700,305

(22) PCT Filed: May 27, 2011

(86) PCT No.: PCT/NZ2011/000087
§ 371 (c)(1),
(2), (4) Date: Feb. 26, 2013

(87) PCT Pub. No.: WO2011/149366
PCT Pub. Date: Dec. 1, 2011

(65) Prior Publication Data
US 2013/0147586 A1    Jun. 13, 2013

(30) Foreign Application Priority Data
May 28, 2010 (NZ) ........................................ 585780

(51) Int. Cl.
| H01L 43/00 | (2006.01) |
| B82Y 25/00 | (2011.01) |
| H01F 10/00 | (2006.01) |
| H01F 41/16 | (2006.01) |
| C23C 14/14 | (2006.01) |
| C23C 14/58 | (2006.01) |
| H01F 10/10 | (2006.01) |
| H01F 1/00 | (2006.01) |
| C23C 14/48 | (2006.01) |
| B82Y 40/00 | (2011.01) |

(52) U.S. Cl.
CPC ................. *C23C 14/14* (2013.01); *B82Y 25/00* (2013.01); *H01F 10/007* (2013.01); *H01F 41/16* (2013.01); *C23C 14/582* (2013.01); *H01F 10/10* (2013.01); *H01F 1/0036* (2013.01); *B82Y 40/00* (2013.01); *C23C 14/48* (2013.01)
USPC ....................................................... 338/32 R

(58) Field of Classification Search
CPC .......... H01L 43/08; H01L 43/10; B03C 1/01; H01F 10/10; H01F 10/007; B82Y 25/00; B82Y 30/00; C23C 14/48
USPC ....................................................... 338/32 R
See application file for complete search history.

(56) References Cited

U.S. PATENT DOCUMENTS 4,127,762 A * 11/1978 Paton et al. ............... 219/121.34
4,371,774 A    2/1983 Strathman et al.
(Continued)

FOREIGN PATENT DOCUMENTS

| EP | 0587181 | 3/1994 |
| JP | 60231924 | 11/1985 |

(Continued)

OTHER PUBLICATIONS

NZ Examination Report, NZ Appln. No. 585780, Jun. 2, 2011, pp. 1-4.
(Continued)

*Primary Examiner* — Kyung Lee
(74) *Attorney, Agent, or Firm* — Dann, Dorfman, Herrell and Skillman, P.C.

(57) ABSTRACT

A method for preparing magnetic materials is disclosed. The magnetic materials are prepared by implanting low energy magnetic ions into a substrate and annealing with a charged particle beam. Magnetic materials comprising magnetic nanoclusters in the near-surface region of a substrate are also disclosed. The magnetic materials are useful in, for example, magneto-electronic devices such as magnetic sensors.

13 Claims, 6 Drawing Sheets

(56) References Cited

U.S. PATENT DOCUMENTS

| | | | |
|---|---|---|---|
| 4,772,976 | A | 9/1988 | Otomo et al. |
| 5,667,924 | A * | 9/1997 | Ziolo ............................ 430/39 |
| 5,729,409 | A | 3/1998 | Ohashi et al. |
| 6,383,574 | B1 | 5/2002 | Han et al. |
| 6,500,497 | B1 | 12/2002 | Wang et al. |
| RE38,474 | E | 3/2004 | Margulies et al. |
| 6,699,332 | B1 | 3/2004 | Piramanayagam et al. |
| 6,864,042 | B1 | 3/2005 | Kuo et al. |
| 7,128,986 | B2 * | 10/2006 | Lamberton et al. ........... 428/812 |
| 7,494,907 | B2 * | 2/2009 | Brown et al. ................. 438/584 |
| 2002/0064891 | A1 | 5/2002 | Gambino et al. |
| 2003/0113582 | A1 | 6/2003 | Litvinov et al. |
| 2005/0215687 | A1 * | 9/2005 | Hatton et al. ................ 524/431 |
| 2007/0178291 | A1 | 8/2007 | Arai et al. |
| 2010/0098873 | A1 | 4/2010 | Verhaverbeke et al. |

FOREIGN PATENT DOCUMENTS

| | | |
|---|---|---|
| JP | 61087871 | 5/1986 |
| JP | 63250461 | 10/1988 |
| RU | 2361320 | 7/2009 |
| WO | 2004067445 | 8/2004 |
| WO | 2006118677 | 11/2006 |
| WO | 2007078316 | 7/2007 |
| WO | 2007117158 | 10/2007 |

OTHER PUBLICATIONS

J. Leveneur et al., Fabrication of Fe nanoclusters using ion implantation and electron beam annealing, 34th Annual Condensed Matter and Materials Meeting, Auckland, NZ, Feb. 2010, p. 54.

A.E. Malik et al., Ferromagnetic Nanoparticles Formed in Silica by Ion Implantation, 34th Annual Condensed Matter and Materials Meeting, Auckland, NZ, Feb. 2010. p. 55.

S. Amirthapandian et al., Formation of Fe nanoclusters embedded in Ge and irradiation induced amorphisation and crystallisation of Fe+ ion implanted Ge, Nuclear Instruments and Methods in Physics Research, B 244 (2006), pp. 52-55.

T.I. Kamins et al., Electron-beam annealing of ion-implantation damage in integrated-circuit devices, J. Appl. Phys, 50 (3), Mar. 1979, pp. 1308-1311.

K.S. Beaty et al., Controlling the Microstrucure and Magnetic Properties of Ferromagnetic Nanocrystals Produced by Ion Implantation, Materials Research Society Symposium Proceedings, vol. 704 (2002), pp. 1-7.

S. Dhara, Formation, Dynamics, and Characterization of Nanostructures by Ion Beam Irradiation, Critical Review in Solid State and Materials Sciences, 2007, pp. 1-50.

V. Ramaswamy et al., Synthesis of Nearly Monodisperse Embedded Nanoparticles by Separating Nucleation and Growth in Ion Implantation, Nano Letters, vol. 5, No. 2, (2005), pp. 373-377.

J. Leveneur et al., Large room temperature magnetoresistance in ion beam synthesized surface Fe nanocluster on SiO2, Applied Physics Letters 89, (2011), pp. 053111-1 to 053111-3.

R.P. Cowburn, Champing at the bit, Nature, vol. 448, No. 2, Aug. 2007, pp. 544, 545.

J. Lenz et al., Magnetic Sensors and Their Applications, IEEE Sensors Journal, vol. 6, No. 3, Jun. 2006, pp. 631-649.

Y. Watanabe et al., Selective, Maskless Growth of InSb on Selenium-treated GaAs by Molecular Beam Epitaxy, Jpn. J. Appl. Phys., vol. 33 (1994), pp. 698-701.

G. De et al., Formation of copper and silver nanometer dimension clusters in silica by the sol-gel process, Applied Physics Letters, 68 (26), (1996), pp. 3820-3822.

P. Lobotka et al., Electric transport in composite Fe—Ta—O granular film prepared by plasma jet technique, Journal of Magnetism and Magnetic Materials, 240, (2002), pp. 491-493.

D. Babonneau et al., Evidence for a self-organized growth in granular Co/Al2O3 multilayers, Applied Physics Letters, vol. 76, No. 20, May 2000, pp. 2892-2894.

N. M. Dempsey et al., Magnetic behavior of Fe:Al2O3 nanocomposite films produced by pulsed laser deposition, Journal of Applied Physics, vol. 90, No. 12, Dec. 2001, pp. 6268-6274.

K. Wegner et al., Cluster beam deposition: a tool for nanoscale science and technology. Journal of Physics D: Applied Physics, 39 (2006), pp. R439-R459.

S.D. Bader, Colloquium: Opportunities in nanomagnetism, Reviews of Modern Physics, vol. 78, No. 1, Jan. 2006, pp. 1-15.

A. Markwitz et al., Homogeneously size distributed Ge nanoclusters embedded in SiO2 layers produced by ion beam synthesis, Nuclear Instruments and Methods in Physics Research, B 147 (1999), pp. 361-366.

F. Gonella, Nanoparticle formation in silicate glasses by ion-beam-based methods, Nuclear Instruments and Methods in Physics Research B 166-167 (2000), pp. 831-839.

X. Ding, et al. Magnetic properties of Fe+-implanted silica films after post-implantation annealing, Journal of Applied Physics vol. 88, No. 5, Sep. 2000, pp. 2745-2749.

X. Ding et al., Aggregation and out diffusion of iron atoms for Fe ion implanted silica films, Journal of Applied Physics, vol. 86, No. 5, Sep. 1999, pp. 2550-2554.

A. Meldrum et al., Nanocomposite Materials Formed by Ion Implantation, Advanced Materials, vol. 13, No. 19, (2001), pp. 1431-1444.

H. Karl et al., Combinatorial ion beam synthesis of semiconductor nanoclusters, Meas. Sci. Technol. 16 (2005), pp. 32-40.

A. Markwitz et al., Nanostructuring at the surface of low-energy lead-implanted silicon by electron beam annealing, Surf. Interface Anal. 40 (2008), pp. 931-934.

A. Tavakoli et al., A Review of Methods for Synthesis of Nanostructured Metals with Emphasis on Iron Compounds, Chem. Pap. 61(3) (2007), pp. 151-170.

S. Johnson et al., Nanostructuring of silicon (100) using electron beam rapid thermal annealing, Journal of Applied Physics vol. 96, No. 1, Jul. 2004, pp. 605-609.

J. Leveneur et al., Fabrication of Fe nanoclusters using ion implantation and electron beam annealing, Appl. Phys. Lett. 98, 053111 (2011).

J. Kennedy et al., Fabrication of surface magnetic nanoclusters using low energy ion implantation and electron beam annealing, Nanotechnology 22 (2011) 115602, pp. 1-6.

* cited by examiner

MAGNETIC NANOCLUSTERS

TECHNICAL FIELD

The present invention relates to magnetic materials. More particularly, but not exclusively, it relates to methods for producing magnetic materials by ion implantation and annealing, the materials produced by those methods and the application of such materials in, for example, magneto-electronic devices such as magnetic sensors.

BACKGROUND ART

Developments in microelectronics often focus on both miniaturization and integration. Miniaturization leads to electronic circuits with a high density of components having dimensions of a few nanometers on a semiconductor substrate. The integration of magnetic sensing elements is desirable for some applications.

Nanostructures have unique properties and have been investigated and used in a variety of applications such as chemical sensing, light-emitting diodes and catalysis. Magnetic nanoparticles have also been used in magnetic storage media.

Thin films with thicknesses of a few nanometers are widely used for many magnetic sensor applications, such as magnetic read heads. Magnetic sensors based on thin films typically include a stack of magnetic and non-magnetic layers as a magnetoresistive sensing element. Tuning the electrical and magnetic properties of the layers can enhance specific magnetoresistive properties of the materials such as giant magnetoresistance (GMR) and anisotropic magnetoresistance (AMR). For example, a magnetic tunneling junction (MTJ) occurs when a voltage bias is applied between two ferromagnetic (FM) layers separated by an insulating layer a few nanometers thick in an external magnetic field. The magnetic field allows the magnetization of the FM layers to be oriented, increasing or decreasing the available energy levels for electrons of different spins. When the magnetizations of the FM layers are set parallel, more electrons will flow from one FM layer to the other, decreasing the overall resistance. The variation of the resistance by this mechanism is called tunneling magnetoresistance (TMR). Because this phenomenon is sensitive to the external magnetic field it can be used as a magnetic sensing method. However, such thin-layer based technologies are typically expensive because they require multiple fabrication steps to form all the layers.

Nanostructured thin films are thin films containing nanostructures. Such films comprising metallic nanostructures embedded in a thin insulator/dielectric matrix show unique properties associated with quantum size effects, with possible applications as enhanced magnetic refrigerants, high density magnetic recording media and magnetoresistance devices.

Methods that have been used to produce magnetic nanostructured films include: molecular beam epitaxy; sol-gel deposition; plasma jet deposition; sputtering ion deposition; pulsed laser deposition; and cluster beam deposition. However, fabrication by standard methods may lack precise control over the number, size and distribution of the nanostructures. This may limit the development of device applications, because each application typically requires specific, precisely controlled properties, including thermal, chemical and magnetic characteristics, and nanostructure shape, size, stability and non-toxicity.

Ion implantation techniques are well-known for semiconductor doping. Nanostructures have been produced by ion implantation followed by vacuum annealing. However, ion implantation or deposition techniques typically use a high metal concentration, which increases the fabrication costs.

Embedded nanostructures have been made using ion implantation. But the amplitude and speed of the magnetic response of such materials is reduced by the embedding matrix. The matrix cannot be perfectly diamagnetic. The matrix can also reduce the speed of changes in the magnetic orientation of the nanostructures, mainly due to magnetoelastic coupling of the nanostructures with the matrix.

Accordingly, it is an object of the present invention to go some way to avoiding the above disadvantages; and/or to at least provide the public with a useful choice.

Other features of the invention may become apparent from the following description which is given by way of example only.

In this specification where reference has been made to patent specifications, other external documents, or other sources of information, this is generally for the purpose of providing a context for discussing the features of the invention. Unless specifically stated otherwise, reference to such external documents is not to be construed as an admission that such documents, or such sources of information, in any jurisdiction, are prior art, or form part of the common general knowledge in the art.

SUMMARY OF THE INVENTION

In a first aspect, the present invention provides a method for producing a magnetic material, the method comprising the steps of:
(a) providing a substrate;
(b) implanting low energy magnetic ions into the substrate; and
(c) in a chamber at less than atmospheric pressure, heating the implanted substrate with a charged particle beam to a peak temperature, optionally holding the peak temperature for a predetermined time, and decreasing the temperature of the implanted substrate to provide the magnetic material.

In a further aspect, the present invention provides a magnetic material produced substantially according to the method of the invention.

In another aspect, the present invention provides a magnetic material comprising a layer of magnetic nanoclusters in a substrate.

In another aspect, the present invention provides a magnetic material comprising a layer of charged particle beam annealed magnetic nanoclusters.

In another aspect, the present invention provides a magnetic material comprising a layer comprising charged particle beam annealed magnetic nanoclusters in a substrate.

In another aspect, the present invention provides a magnetic material comprising charged particle beam annealed magnetic nanoclusters in a substrate.

In another aspect, the present invention provides a magnetic material comprising a near surface band comprising magnetic nanoclusters in a substrate.

In another aspect, the present invention provides a magneto-electric device comprising a magnetic material of the invention.

In another aspect, the present invention provides a method for manufacturing an electronic integrated circuit that comprises producing a magnetic material by the method of the invention.

In another aspect, the present invention provides an electronic circuit comprising a magnetic material of the invention.

In another aspect, the present invention provides an electronic circuit comprising a magneto-electric device of the invention.

In another aspect, the present invention provides a magnetic material of the invention for use in a magneto-electronic device.

This invention may also be said broadly to consist in the parts, elements and features referred to or indicated in the specification of the application, individually or collectively, and any or all combinations of any two or more said parts, elements or features, and where specific integers are mentioned herein which have known equivalents in the art to which this invention relates, such known equivalents are deemed to be incorporated herein as if individually set forth.

In addition, where features or aspects of the invention are described in terms of Markush groups, those persons skilled in the art will appreciate that the invention is also thereby described in terms of any individual member or subgroup of members of the Markush group.

As used herein "(s)" following a noun means the plural and/or singular forms of the noun.

As used herein the term "and/or" means "and" or "or" or both.

As used herein, the term "nanocluster" means a cluster with at least one dimension in the range about 1 nm to about 100 nm.

As used herein, the term "magnetic material" means a material that is paramagnetic, superparamagnetic, ferromagnetic, ferrimagnetic, and/or antiferromagnetic.

As used herein, the term "magnetic nanocluster" means a nanocluster that is paramagnetic, superparamagnetic, ferromagnetic, ferrimagnetic, and/or antiferromagnetic.

The term "comprising" as used in this specification means "consisting at least in part of". When interpreting each statement in this specification that includes the term "comprising", features other than that or those prefaced by the term may also be present. Related terms such as "comprise" and "comprises" are to be interpreted in the same manner.

It is intended that reference to a range of numbers disclosed herein (for example, 1 to 10) also incorporates reference to all rational numbers within that range (for example, 1, 1.1, 2, 3, 3.9, 4, 5, 6, 6.5, 7, 8, 9 and 10) and also any range of rational numbers within that range (for example, 2 to 8, 1.5 to 5.5 and 3.1 to 4.7) and, therefore, all sub-ranges of all ranges expressly disclosed herein are hereby expressly disclosed. These are only examples of what is specifically intended and all possible combinations of numerical values between the lowest value and the highest value enumerated are to be considered to be expressly stated in this application in a similar manner.

Although the present invention is broadly as defined above, those persons skilled in the art will appreciate that the invention is not limited thereto and that the invention also includes embodiments of which the following description gives examples.

BRIEF DESCRIPTION OF THE FIGURES

The invention will now be described with reference to the Figures in which.

DETAILED DESCRIPTION OF THE INVENTION

Figure 1:
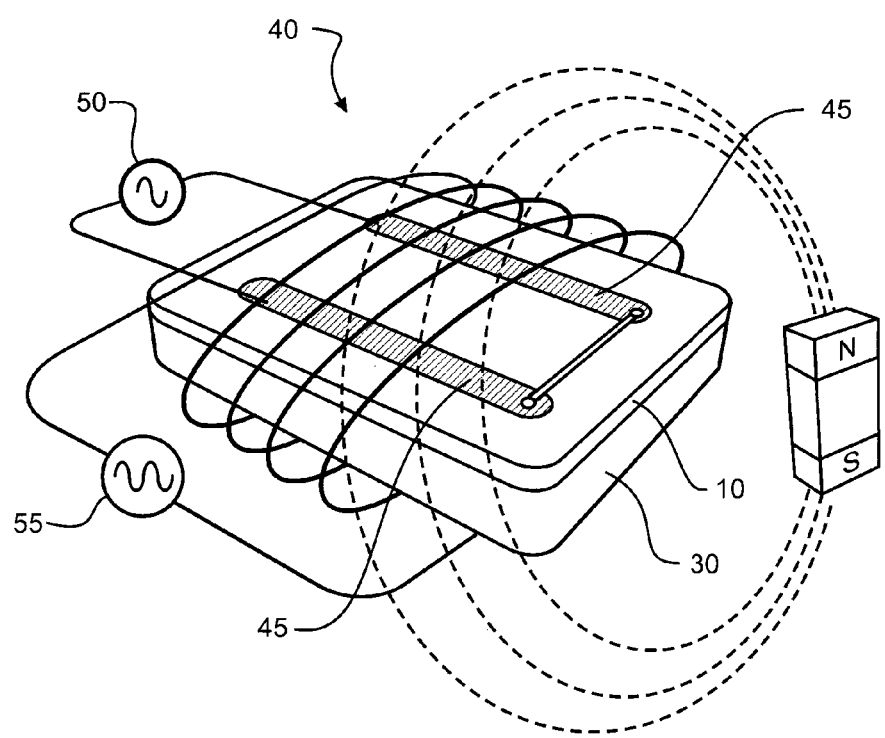
FIG. 1 is a schematic diagram of one embodiment of a nanostructured core fluxgate.

The combination of low energy ion implantation with charged particle beam annealing provides a convenient method for the fabrication of magnetic materials comprising near surface magnetic nanocluster bands in a substrate. Unlike chemical synthetic methods, this combination generally avoids the formation of side products that would otherwise require purification treatments after the fabrication. In addition, the ion implantation and annealing procedures initiate phase separation processes, which allow control over the depth, distribution and number of implanted atoms and resulting magnetic nanoclusters during fabrication of the magnetic material.

Accordingly, in a first aspect, the present invention provides a method for producing a magnetic material, the method comprising the steps of (a) providing a substrate;
(b) implanting low energy magnetic ions into the substrate; and
(c) in a chamber at less than atmospheric pressure, heating the implanted substrate with a charged particle beam to a peak temperature, optionally holding the peak temperature for a predetermined time, and decreasing the temperature of the implanted substrate to provide the magnetic material.

Substrate

The substrate is preferably an electrical insulator. In some embodiments, the substrate is a dielectric.

The substrate may be crystalline or amorphous.

In some embodiments, the substrate is an insulating oxide or nitride.

In some embodiments, the substrate is selected from the group consisting of silicon dioxide; aluminium oxide; silicon nitride; zirconium oxide; magnesium oxide; and hafnium oxide. Preferably, the substrate is selected from the group consisting of: silicon dioxide; aluminium oxide; silicon nitride; and magnesium oxide. In another preferred embodiment, the substrate is selected from the group consisting of silicon dioxide; aluminium oxide; and silicon nitride. More preferably, the substrate is selected from silicon dioxide or silicon nitride.

In some embodiments, the substrate comprises a layer of an electrical insulator on a second material. Suitable materials are known to those skilled in the art. Preferred materials include semi-conductors and insulators including, but not limited to: carbon; germanium; silicon; silicon dioxide; and glass.

In some embodiments, the substrate comprises a layer of silicon dioxide or silicon nitride on silicon.

The substrate may be undoped, or at least a layer of the substrate may be modified by known doping techniques.

In some embodiments, the substrate is doped with hydrogen, helium, lithium, or beryllium ions. In some preferred embodiments, the substrate is doped with hydrogen or helium ions. The substrate may be doped, for example, by ion implantation.

Accordingly, in some embodiments, the method of the invention further comprises, prior to step (b), the additional step of pre-doping the substrate by implanting hydrogen, helium, lithium, or beryllium ions into the substrate. Optionally, the pre-doped substrate may be annealed before implantation of the low energy magnetic ions.

Ion Implantation

Ion implantation is a process by which ions of a material can be implanted into another solid, thereby changing the properties of the solid. The ions induce both a chemical change in the target, because they can be a different element than the target, and a structural change, because the crystal structure of the target can be damaged or even destroyed.

Ion implantation equipment is well-known in the art, and typically comprises: an ion source; an accelerator, where the ions are electrostatically accelerated to the selected energy; beam guidance systems; and a target chamber, where the ions impinge on a target, which is the substrate to be implanted.

Preferably, the step of implanting low energy magnetic ions uses a mass-separated focused beam of low energy magnetic ions. In some preferred embodiments, the beam is isotopically separated.

In some preferred embodiments, the step of implanting low energy magnetic ions is carried out at room temperature. In other embodiments, the implantation is carried out at reduced or elevated temperatures. Temperature controlled ion implantation techniques are known in the art.

Magnetic ions have a magnetic moment. Preferably, the magnetic ions are selected from the group consisting of: iron; cobalt; nickel; samarium; neodymium; and chromium.

In some preferred embodiments, the magnetic ions are selected from the group consisting of: iron; cobalt; samarium; and nickel.

In some preferred embodiments, the magnetic ions are selected from the group consisting of iron; cobalt; and nickel.

The invention also contemplates embodiments in which two or more ions are sequentially implanted. Those persons skilled in the art will appreciate that, to form magnetic nanoclusters, the implanted ions must have the proper electronic organisation, either independently or as part of the nanocluster formed from the ions during the method of the invention, to have a non-zero magnetic moment. That is, the implanted ions and the resulting nanocluster must have unpaired electrons. An atom which does not have the proper electronic configuration cannot independently have a non-zero magnetic moment, and can only form a magnetic nanocluster with another atom that has the proper electronic configuration.

Accordingly, in these embodiments, all of the ions may be magnetic or only one of the ions may be magnetic. In these embodiments, the ions are preferably selected from the group consisting of: iron; cobalt; nickel; samarium; neodymium; chromium; oxygen; and boron. In these embodiments, the ions are more preferably selected from the group consisting of: iron; cobalt; and samarium.

For example, in those embodiments wherein it is desirable to form iron oxide magnetic nanoclusters in the substrate, iron and oxygen ions may be sequentially implanted.

Similarly, in those embodiments wherein it is desirable to form iron/cobalt or samarium/cobalt magnetic nanoclusters in the substrate, iron and cobalt ions or samarium and cobalt ions may be sequentially implanted.

In some preferred embodiments, the ion beam consists of singly charged ions, but the invention is not limited thereto. For example, in some embodiments wherein the implanted ion is iron, the implanted ions may be $Fe^+$, $Fe^{2+}$ or $Fe^{3+}$.

Those persons skilled in the art will appreciate that the acceleration voltage required for a doubly charged ion, for example, is half that for a singly charged ion to reach the same ion energy. However, the current density during implantation of a doubly charged ion, for example, will be less than that for the corresponding singly charged ion due to the higher ionisation energy. The reduced current density during the implantation will decrease the ion flux and increase the time required to achieve the same fluence for the doubly charged ion as the singly charged ion.

Typical ion energies for ion implantation are in the range of 10-500 keV. However, in the methods of the present invention, it is preferred that the ions only penetrate the substrate to a depth of between about 5 nm and about 100 nm. In other preferred embodiments, the ions penetrate the substrate to a depth of between about 5 nm and about 50 nm.

In other embodiments, the ions penetrate the substrate to a depth of between about 5 nm and about 40 nm, between about 5 nm and about 30 nm, or between about 5 nm and about 20 nm.

In other embodiments, the ions penetrate the substrate to a depth of up to about 5 nm, about 10 nm, about 15 nm, about 20 nm, about 25 nm, about 30 nm, about 35 nm, about 40 nm, about 45 nm, about 50 nm, about 55 nm, about 60 nm, about 65 nm, about 70 nm, about 75 nm, about 80 nm, about 85 nm, about 90 nm, about 95 nm, or about 100 nm.

Accordingly, the ion energies are relatively low, generally between about 1 keV and about 100 keV. Energies lower than this result in very little damage to the target, and are generally described as ion beam deposition.

In some embodiments, the ion beam is substantially perpendicular to the substrate.

Preferably, the ions are implanted with a beam energy below about 70 keV. In certain embodiments, the ions are implanted with a beam energy between about 5 keV and about 70 keV. Alternatively, the ions may be implanted with a beam energy between about 5 keV and about 50 keV. In other preferred embodiments, the ions are implanted with a beam energy below about 50 keV, below about 45 keV, below about 40 keV, below about 35 keV, below about 30 keV, below about 25 keV, below about 20 keV, or below about 15 keV. In other preferred embodiments, the ions are implanted with a beam energy below about 50 keV, below about 45 keV, below about 40 keV, below about 35 keV, below about 30 keV, below about 25 keV, or below about 20 keV. In other preferred embodiments, the ions are implanted with a beam energy about 50 keV or less, about 45 keV or less, about 40 keV or less, about 35 keV or less, about 30 keV or less, about 25 keV or less, about 20 keV or less, or about 15 keV or less. In other preferred embodiments, the ions are implanted with a beam energy about 50 keV or less, about 45 keV or less, about 40 keV or less, about 35 keV or less, about 30 keV or less, about 25 keV or less, or about 20 keV or less.

In some preferred embodiments, the ions may be implanted with a beam energy between about 5 keV and about 20 keV.

In some preferred embodiments, the ions may be implanted with a beam energy between about 5 keV and about 15 keV.

Those persons skilled in the art will appreciate that there is a relationship between the depth to which an ion will penetrate the substrate and the nature and energy of that ion and the angle of incidence of the ion beam on the substrate. For example, perpendicular implantation of 15 keV $^{56}Fe^+$ ions into silicon dioxide results in a maximum concentration of the ions between about 10 nm and about 15 nm, with a maximum depth of about 30 nm, while the maximum depth for 7.5 keV $^{56}Fe^+$ ions into silicon dioxide is about 17 nm, the maximum depth for 20 keV $^{62}Sm^+$ ions into silicon dioxide is about 25 nm, and the maximum depth for 8 keV $^5B^+$ ions into silicon dioxide is about 65 nm.

In some preferred embodiments, the implantation ion beam is raster scanned over the surface of the substrate to allow for a homogeneous implantation. Once the required ion fluence is reached the implantation ion beam is shut off.

The ion fluence is the product of the ion flux that is incident on the substrate during the implantation and the time. In some embodiments of the present invention, the ion fluence is between about $1.0 \times 10^{15}$ ions/cm$^2$ and about $1.0 \times 10^{17}$ ions/cm$^2$. In some preferred embodiments, the ion fluence is between about $1.0 \times 10^{15}$ ions/cm$^2$ and about $8.5 \times 10^{16}$ ions/cm$^2$. In some preferred embodiments, the ion fluence is between about $1.0 \times 10^{15}$ ions/cm$^2$ and about $5.0 \times 10^{16}$ ions/cm$^2$. In other preferred embodiments, the ion fluence is about $1.0 \times 10^{16}$ ions/cm$^2$.

Advantageously, the methods of the present invention enable accurate control over the concentration of the implanted ions and the depth of implantation of the ions.

Charged Particle Beam Annealing

Charged particle beam annealing is used in the heating/annealing step (c) following implantation of the magnetic ions in step (b). After the implantation, the substrate is transferred from the implantation chamber to the charged particle beam annealing chamber in those embodiments wherein separate apparatus are used for the implantation and annealing. Transfer time is not important. The implanted samples can be stored under environmentally controlled conditions—that is, in a clean environment, at low humidity and at a typical room temperature of about 20° C.—for days.

Charged particle beam annealing is a very precise technique whereby the target (which is the implanted substrate) can be heated in a controlled fashion under a high vacuum—a residual gas pressure of less than about $1 \times 10^{-6}$ mbar. In some preferred embodiments, the residual gas pressure is about $2 \times 10^{-7}$ mbar, or less. In some preferred embodiments, the residual gas pressure is about $1 \times 10^{-7}$ mbar, or less.

Preferably, an electron beam is used in the heating/annealing step (c).

Other charged particle beams that may be used include ion beams, proton beams and positron beams. In some embodiments, a proton beam is used in the heating/annealing step. In other embodiments, a positron beam is used in the heating/annealing step.

In some preferred embodiments, the charged particle beam annealing apparatus includes a liquid nitrogen trap positioned close to the sample holder in order to maintain a sufficiently impurity-free (for example, hydrocarbon-free) environment throughout the annealing step. It is preferable to use a sufficiently impurity-free environment during the annealing because the substrate target is penetrated and damaged during the ion implantation step, making it susceptible to any impurity.

The charged particle beam annealing process typically begins at room temperature and proceeds in two or three stages. In the first stage, the implanted substrate is heated to the peak temperature. In the optional second stage, the peak temperature is maintained for a period of time. In the third stage of the annealing process, the substrate is allowed to cool to room temperature before being removed from the annealing chamber.

In those embodiments wherein the charged particle beam is an electron beam, the implanted substrate is heated to the peak temperature, preferably between about 500° C. and about 1400° C., optionally held at the peak temperature, and then cooled to room temperature.

The peak temperature to which the implanted substrate is heated is below the melting point of the substrate. In those embodiments wherein the substrate is crystalline, the peak temperature is typically below about 1200° C. Higher peak temperatures may be used in some embodiments wherein the substrate is amorphous.

Those persons skilled in the art will appreciate that the minimum peak temperature can be selected based on the thermodynamic equilibrium of the phase from which the desired magnetic nanoclusters are formed. For example, the formation of a SmCo$_5$ phase requires a minimum peak temperature of about 1100° C.

Preferably, the electron beam is raster scanned over the substrate surface in the heating step. The electron beam is typically raster scanned over the substrate with a frequency between about 1 and about 10 kHz. The frequency of raster scanning is generally selected to provide homogeneity of the temperature across the substrate surface.

Preferably, the energy of the electron beam is about 20 keV.

The substrate can be heated with a temperature gradient of between about 1° C./s and about 1000° C./s. In some embodiments, the temperature gradient is between about 1° C./s and about 100° C./s, preferably between about 1° C./s and about 50° C./s, more preferably between about 5° C./s and about 20° C./s.

In some preferred embodiments, the peak temperature is between about 600° C. and about 1200° C. In other preferred embodiments, the peak temperature is between about 600° C. and about 1180° C. In other preferred embodiments, the peak temperature is about 600° C., about 800° C., about 1000° C., or about 1180° C. In other preferred embodiments, the peak temperature is about 600° C., about 800° C., about 940° C., about 1000° C., or about 1180° C. In other preferred embodiments, the peak temperature is about 600° C., about 800° C., about 940° C. or about 1000° C. In other preferred embodiments, the peak temperature is about 600° C., about 800° C., or about 1000° C.

In some preferred embodiments, wherein SmCo$_5$ nanoclusters are formed, the peak temperature is about 1180° C.

In other preferred embodiments, wherein iron, nickel, cobalt, iron/cobalt or samarium/cobalt nanoclusters are formed, the peak temperature is about 600° C., about 800° C., about 940° C. or about 1000° C.

In other preferred embodiments, wherein iron, nickel, cobalt or iron/cobalt nanoclusters are formed, the peak temperature is about 600° C., about 800° C., or about 1000° C.

In some embodiments, the peak temperature is held for between about 0 seconds and about three hours, but the peak temperature may be held for longer. In some preferred embodiments, the peak temperature is held for between about 5 seconds and about two hours.

The temperature of the substrate can be decreased with a temperature gradient of between about −1° C./s and about −200° C./s. In some embodiments, the temperature gradient is between about −1° C./s and about −100° C./s, preferably between about −1° C./s and about −50° C./s, more preferably between about −5° C./s and about −20° C./s.

In some embodiments of the invention, ion implantation and annealing (steps (b) and (c)) are performed simultaneously. In these embodiments, the angles of incidence of the ion beam and the charged particle beam are selected so that both impinge on the substrate simultaneously.

After annealing, the substrate may be removed from the annealing chamber into the ambient atmosphere.

During the charged particle beam annealing, the implanted ions aggregate to form magnetic nanoclusters in the substrate.

Charged particle beam annealing enhances the mobility of the implanted ions and, therefore, nanocluster growth. In addition, the charged particle beam annealing ablates the surface of the substrate, which results in the appearance of nanoclusters at the substrate surface. For example, analysis by Rutherford back scattering spectrometry (RBS) showed the thickness of a silicon dioxide substrate implanted with 15 keV $^{56}$Fe$^+$ ions at a fluence of $1 \times 10^{17}$ ions/cm$^2$ decreased by 40 nm after electron beam annealing for 2 hours at 1000° C. at a pressure of $2 \times 10^{-7}$ mbar.

The rate of ablation of the substrate during the charged particle beam annealing depends on, for example, the nature of the charged particle beam and the substrate. For example, the rate of ablation will differ where a proton beam is used during the heating/annealing step compared to an electron beam. Similarly, the rate of ablation during electron beam annealing will be greater where the substrate is silicon dioxide compared to silicon nitride.

Some embodiments of the present invention provide a method for producing a magnetic material comprising magnetic nanoclusters in an electrically insulating substrate, the method comprising the steps of:
(a) providing the electrically insulating substrate;
(b) implanting a first species of low energy ions, selected from the group consisting of:
iron; cobalt; nickel; samarium; neodymium; and chromium ions, to a depth between about 5 nm and about 1.00 nm into the substrate; and
optionally, implanting one or more species of low energy ions, selected from a second group consisting of iron; cobalt; nickel; samarium; neodymium; chromium; oxygen; and boron ions, to a depth between about 5 nm and about 100 nm into the substrate, wherein the species selected from the second group are different from the first species; and
(c) in a chamber at a pressure less than about $1 \times 10^{-6}$ mbar, heating the implanted substrate with an electron beam to a peak temperature between about 500° C. and about 1400° C., optionally holding the peak temperature for a predetermined time, such that the implanted ions aggregate to form magnetic nanoclusters, and decreasing the temperature of the implanted substrate, to provide the magnetic material.

Some embodiments of the present invention provide a method for producing a magnetic material comprising magnetic nanoclusters in an electrically insulating substrate, the method comprising the steps of:
(a) providing the electrically insulating substrate;
(b) implanting a first species of low energy ions, selected from the group consisting of:
iron; cobalt; nickel; samarium; neodymium; and chromium ions, to a depth between about 5 nm and about 100 nm into the substrate; and
optionally, implanting one or more species of low energy ions, selected from a second group consisting of iron; cobalt; nickel; samarium; neodymium; chromium; oxygen; and boron ions, to a depth between about 5 nm and about 100 nm into the substrate, wherein the species selected from the second group are different from the first species; and
(c) in a chamber at a pressure less than about $1 \times 10^{-6}$ mbar, heating the implanted substrate with an electron beam to a peak temperature and for a time effective to aggregate the implanted ions to form magnetic nanoclusters, and decreasing the temperature of the implanted substrate, to provide the magnetic material.

Some embodiments of the present invention provide a method for producing a magnetic material comprising magnetic nanoclusters in an electrically insulating substrate, the method comprising the steps of
(a) providing the electrically insulating substrate;
(b) implanting at least one species of magnetic ion, selected from the group consisting of:
iron; cobalt; nickel; and samarium ions, into the substrate with a beam energy between about 5 keV and about 50 keV and a fluence between about $1.0 \times 10^{15}$ ions/cm$^2$ and about $1.0 \times 10^{17}$ ions/cm$^2$; and
(c) in a chamber at a pressure less than about $1 \times 10^{-6}$ mbar, heating the implanted substrate with an electron beam to a peak temperature between about 600° C. and about 1200° C., optionally holding the peak temperature for a predetermined time, such that the implanted ions aggregate to form magnetic nanoclusters, and decreasing the temperature of the implanted substrate, to provide the magnetic material.

Some embodiments of the present invention provide a method for producing a magnetic material comprising magnetic nanoclusters in an electrically insulating substrate, the method comprising the steps of:
(a) providing the electrically insulating substrate;
(b) implanting at least one species of magnetic ion, selected from the group consisting of:
iron; cobalt; nickel; and samarium ions, into the substrate with a beam energy between about 5 keV and about 50 keV and a fluence between about $1.0 \times 10^{15}$ ions/cm$^2$ and about $1.0 \times 10^{17}$ ions/cm$^2$; and
(c) in a chamber at a pressure less than about $1 \times 10^{-6}$ mbar, heating the implanted substrate with an electron beam to a peak temperature and for a time effective to aggregate the implanted ions to form magnetic nanoclusters, and decreasing the temperature of the implanted substrate, to provide the magnetic material.

Some embodiments of the present invention provide a method for producing a magnetic material comprising magnetic nanoclusters in an insulating oxide or nitride substrate, the method comprising the steps of:
(a) providing the insulating oxide or nitride substrate;
(b) implanting at least one species of magnetic ion, selected from the group consisting of:
iron; cobalt; nickel; and samarium ions, into the substrate with a beam energy between about 5 keV and about 50 keV and a fluence between about $1.0 \times 10^{15}$ ions/cm$^2$ and about $1.0 \times 10^{17}$ ions/cm$^2$; and
(c) in a chamber at a pressure less than about $1 \times 10^{-6}$ mbar, heating the implanted substrate with an electron beam to a peak temperature between about 600° C. and about 1200° C., optionally holding the peak temperature for a predetermined time, such that the implanted ions aggregate to form magnetic nanoclusters, and decreasing the temperature of the implanted substrate, to provide the magnetic material.

Some embodiments of the present invention provide a method for producing a magnetic material comprising magnetic nanoclusters in an insulating oxide or nitride substrate, the method comprising the steps of:
- (a) providing the insulating oxide or nitride substrate;
- (b) implanting at least one species of magnetic ion, selected from the group consisting of:
  iron; cobalt; nickel; and samarium ions, into the substrate with a beam energy between about 5 keV and about 50 keV and a fluence between about $1.0 \times 10^{15}$ ions/cm$^2$ and about $1.0 \times 10^{17}$ ions/cm$^2$; and
- (c) in a chamber at a pressure less than about $1 \times 10^{-6}$ mbar, heating the implanted substrate with an electron beam to a peak temperature and for a time effective to aggregate the implanted ions to form magnetic nanoclusters, and decreasing the temperature of the implanted substrate, to provide the magnetic material.

Some embodiments of the present invention provide a method for producing a magnetic material comprising magnetic nanoclusters in an insulating oxide or nitride substrate, the method comprising the steps of:
- (a) providing the insulating oxide or nitride substrate;
- (b) implanting iron, cobalt, or nickel ions into the substrate with a beam energy between about 5 keV and about 50 keV and a fluence between about $1.0 \times 10^{15}$ ions/cm$^2$ and about $1.0 \times 10^{17}$ ions/cm$^2$; and
- (c) in a chamber at a pressure less than about $1 \times 10^{-6}$ mbar, heating the implanted substrate with an electron beam to a peak temperature between about 600° C. and about 1200° C., optionally holding the peak temperature for a predetermined time, such that the implanted ions aggregate to form magnetic nanoclusters, and decreasing the temperature of the implanted substrate, to provide the magnetic material.

Some embodiments of the present invention provide a method for producing a magnetic material comprising magnetic nanoclusters in an insulating oxide or nitride substrate, the method comprising the steps of:
- (a) providing the insulating oxide or nitride substrate;
- (b) implanting iron, cobalt, or nickel ions into the substrate with a beam energy between about 5 keV and about 50 keV and a fluence between about $1.0 \times 10^{15}$ ions/cm$^2$ and about $1.0 \times 10^{17}$ ions/cm$^2$; and
- (c) in a chamber at a pressure less than about $1 \times 10^{-6}$ mbar, heating the implanted substrate with an electron beam to a peak temperature and for a time effective to aggregate the implanted ions to form magnetic nanoclusters, and decreasing the temperature of the implanted substrate, to provide the magnetic material.

Some embodiments of the present invention provide a method for producing a magnetic material comprising magnetic nanoclusters in an insulating oxide or nitride substrate, the method comprising the steps of
- (a) providing the insulating oxide or nitride substrate;
- (b) implanting iron ions or samarium ions into the substrate with a beam energy between about 5 keV and about 50 keV and a fluence between about $1.0 \times 10^{15}$ ions/cm$^2$ and about $1.0 \times 10^{17}$ ions/cm$^2$ then implanting cobalt ions into the substrate with a beam energy between about 5 keV and about 50 keV and a fluence between about $1.0 \times 10^{15}$ ions/cm$^2$ and about $1.0 \times 10^{17}$ ions/cm$^2$; and
- (c) in a chamber at a pressure less than about $1 \times 10^{-6}$ mbar, heating the implanted substrate with an electron beam to a peak temperature between about 600° C. and about 1200° C., optionally holding the peak temperature for a predetermined time, such that the implanted ions aggregate to form magnetic nanoclusters, and decreasing the temperature of the implanted substrate, to provide the magnetic material.

Some embodiments of the present invention provide a method for producing a magnetic material comprising magnetic nanoclusters in an insulating oxide or nitride substrate, the method comprising the steps of:
- (a) providing the insulating oxide or nitride substrate;
- (b) implanting iron ions or samarium ions into the substrate with a beam energy between about 5 keV and about 50 keV and a fluence between about $1.0 \times 10^{15}$ ions/cm$^2$ and about $1.0 \times 10^{17}$ ions/cm$^2$ then implanting cobalt ions into the substrate with a beam energy between about 5 keV and about 50 keV and a fluence between about $1.0 \times 10^{15}$ ions/cm$^2$ and about $1.0 \times 10^{17}$ ions/cm$^2$; and
- (c) in a chamber at a pressure less than about $1 \times 10^{-6}$ mbar, heating the implanted substrate with an electron beam to a peak temperature and for a time effective to aggregate the implanted ions to form magnetic nanoclusters, and decreasing the temperature of the implanted substrate, to provide the magnetic material.

Structural Properties

In a further aspect, the present invention provides a magnetic material produced substantially according to the method of the invention.

In another aspect, the present invention provides a magnetic material comprising a layer of magnetic nanoclusters in a substrate.

In another aspect, the present invention provides a magnetic material comprising a layer of charged particle beam annealed magnetic nanoclusters.

In another aspect, the present invention provides a magnetic material comprising a layer comprising charged particle beam annealed magnetic nanoclusters in a substrate.

In another aspect, the present invention provides a magnetic material comprising charged particle beam annealed magnetic nanoclusters in a substrate.

In another aspect, the present invention provides a magnetic material comprising a near surface band comprising magnetic nanoclusters in a substrate.

In some embodiments, the layer or band comprising magnetic nanoclusters has a maximum depth in the substrate of about 5 nm, about 10 nm, about 15 nm, about 20 nm, about 25 nm, about 30 nm, about 35 nm, about 40 nm, about 45 nm, about 50 nm, about 55 nm, about 60 nm, about 65 nm, about 70 nm, about 75 nm, about 80 nm, about 85 nm, about 90 nm, about 95 nm, or about 100 nm.

In other preferred embodiments, the layer or band comprising magnetic nanoclusters is between a depth in the substrate of about 0 nm and about 100 nm, about 0 nm and about 90 nm, about 0 nm and about 80 nm, about 0 nm and about 70 nm, about 0 nm and about 60 nm, about 0 nm and about 50 nm, about 0 nm and about 40 nm, about 0 nm and about 30 nm, about 0 nm and about 20 nm, about 0 nm and about 15 nm, or about 0 nm and about 10 nm.

In some embodiments, the magnetic material comprises an homogeneously dispersed layer of magnetic nanoclusters in the substrate.

In some embodiments, the magnetic nanoclusters are embedded to a maximum depth of about 100 nm in the substrate. In other embodiments, the magnetic nanoclusters are embedded to a maximum depth of about 50 nm in the substrate. In other embodiments, the magnetic nanoclusters are embedded to a maximum depth in the substrate of about 5 nm, about 10 nm, about 15 nm, about 20 nm, about 25 nm, about 30 nm, about 35 nm, about 40 nm, about 45 nm, about 50 nm, about 55 nm, about 60 nm, about 65 nm, about 70 nm, about 75 nm, about 80 nm, about 85 nm, about 90 nm, about 95 nm, or about 100 nm.

In some preferred embodiments, the magnetic material comprises a layer comprising magnetic nanoclusters about 0 to about 5 nm deep in the substrate. In other preferred embodiments, the magnetic nanoclusters are between a depth of about 0 nm and about 100 nm in the substrate. In other preferred embodiments, the magnetic nanoclusters are between a depth of about 0 nm and about 50 nm. In other preferred embodiments, the magnetic nanoclusters are between a depth of about 0 nm and about 100 nm, about 0 nm and about 90 nm, about 0 nm and about 80 nm, about 0 nm and about 70 nm, about 0 nm and about 60 nm, about 0 nm and about 50 nm, about 0 nm and about 40 nm, about 0 nm and about 30 nm, about 0 nm and about 20 nm, about 0 nm and about 15 nm, or about 0 nm and about 10 nm.

In some embodiments, the nanoclusters are quasi-spherical. In some preferred embodiments, the nanoclusters are substantially spherical.

In some preferred embodiments, the nanoclusters are near monodispersed.

In some embodiments, the magnetic nanoclusters have a diameter of about 80 nm or less. In other embodiments, the magnetic nanoclusters have a diameter less than about 50 nm. In other embodiments, the magnetic nanoclusters have a diameter between about 5 nm and about 30 nm. In other embodiments, the magnetic nanoclusters have a diameter between about 5 nm and about 10 nm.

In some embodiments, the distance separating the nanoclusters is up to about 50 nm.

In some embodiments, the magnetic nanoclusters comprise iron; iron oxide; cobalt; iron/cobalt, preferably FeCo; samarium/cobalt, preferably $SmCo_5$ or $Sm_2Co_{17}$; nickel; neodymium/iron/boron, preferably $Nd_2Fe_{14}B$; iron/nickel, preferably FeNi; or chromium oxide, preferably $CrO_2$.

In some embodiments, the magnetic nanoclusters comprise iron; cobalt; iron/cobalt, samarium/cobalt; or nickel.

Some embodiments of the present invention provide a magnetic material comprising a layer comprising magnetic nanoclusters between a depth of about 0 nm and about 100 nm in an electrically insulating substrate, wherein the nanoclusters have a diameter of about 80 nm or less.

Some embodiments of the present invention provide a magnetic material comprising a layer comprising magnetic nanoclusters between a depth of about 0 nm and about 100 nm in an electrically insulating substrate, wherein the nanoclusters comprise iron, cobalt, iron/cobalt, samarium, samarium/cobalt or nickel, and wherein the nanoclusters have a diameter of about 80 nm or less.

Some embodiments of the present invention provide a magnetic material comprising a layer comprising magnetic nanoclusters between a depth of about 0 nm and about 100 nm in an electrically insulating substrate, wherein the nanoclusters comprise iron, cobalt, iron/cobalt, samarium/cobalt or nickel, and wherein the nanoclusters have a diameter of about 80 nm or less.

Some embodiments of the present invention provide a magnetic material comprising magnetic nanoclusters between a depth of about 0 nm and about 100 nm in an electrically insulating substrate, wherein the nanoclusters have a diameter of about 80 nm or less.

Some embodiments of the present invention provide a magnetic material comprising magnetic nanoclusters between a depth of about 0 nm and about 100 nm in an electrically insulating substrate, wherein the nanoclusters comprise iron, cobalt, iron/cobalt, samarium, samarium/cobalt or nickel, and wherein the nanoclusters have a diameter of about 80 nm or less.

Some embodiments of the present invention provide a magnetic material comprising magnetic nanoclusters between a depth of about 0 nm and about 100 nm in an electrically insulating substrate, wherein the nanoclusters comprise iron, cobalt, iron/cobalt, samarium/cobalt or nickel, and wherein the nanoclusters have a diameter of about 80 nm or less.

Magnetic Properties

The coercive field of a magnetic material is dependent on the particle size of that material. As the particle size increases, so does the coercive field. Accordingly, the magnetic behaviour of ferromagnetic, antiferromagnetic or ferrimagnetic materials changes to superparamagnetism as the particle size of these materials get small. Very small nanoclusters of ferromagnetic, antiferromagnetic or ferrimagnetic materials will tend to be superparamagnetic.

Superparamagnetic materials do not retain the magnetic moment once the applied field is removed, meaning they have zero coercivity. This behaviour is also exhibited by paramagnetic materials, but superparamagnetic materials have a much larger saturation magnetisation (comparable to those exhibited by ferromagnetic materials) and respond much more effectively towards the applied field than paramagnetic materials.

Ferromagnetic materials have non-zero coercivity. They retain certain magnetisation after the removal of an applied field, and a field of opposite direction is required to bring the magnetisation back to zero. Greater field strength is needed if the material has larger coercivity.

Both the coercivity and saturation magnetisation are dependent upon the material, nanostructure size, and temperature. At a sufficiently small nanocluster size, a ferromagnetic material can exhibit superparamagnetism when the thermal energy is able to overcome the magnetisation of the entire nanocluster. On the other hand, a superparamagnetic material can become ferromagnetic at temperatures below its blocking temperature, which is the minimum temperature required for sufficient thermal energy to overcome the magnetisation.

For example, iron nanoclusters become superparamagnetic at room temperature when the diameter is less than about 15 nm, and ferromagnetic if it is larger than 15 nm. Materials such as $Fe_3O_4$ are superparamagnetic at a diameter of about 50 nm or smaller.

In addition to the size of the nanoclusters within the substrate, the magnetic properties (for example, the coercivity) of the magnetic material of the present invention will depend on both the composition and the distribution of the magnetic nanoclusters in the substrate.

In some embodiments, the nanoclusters and the magnetic material are soft ferromagnetic at room temperature. In other embodiments, the nanoclusters and the magnetic material are superparamagnetic at room temperature.

Evaluation of the magnetic materials of the present invention shows that the magnetization per atom of implanted species is generally equivalent to or greater than that of the bulk material.

In some embodiments, the magnetic material has a magnetic coercivity less than about 1500 Oe at 5 K. In other embodiments, the magnetic material has a magnetic coercivity less than about 1000 Oe at 5 K. In other embodiments, the magnetic material has a magnetic coercivity less than about 500 Oe at 5 K.

In some preferred embodiments, wherein the magnetic nanoclusters comprise iron, nickel or cobalt in silicon dioxide, the magnetic material has a magnetic coercivity less than about 50 Oe at 5 K.

In other preferred embodiments, wherein the magnetic nanoclusters comprise iron/cobalt in silicon dioxide, the magnetic material has a magnetic coercivity of about 200 Oe at 5 K.

In other preferred embodiments, wherein the magnetic nanoclusters comprise samarium/cobalt in silicon dioxide, the magnetic material has a magnetic coercivity of about 500 Oe at 5 K.

Because of their position at and/or near the surface of the substrate, the magnetic nanoclusters are less magnetically bonded to the substrate than more deeply embedded nanoclusters. This allows a faster response to the external magnetic field. In addition, the insulator gap between two adjacent nanoclusters is small. This makes a tunneling junction possible between two adjacent nanoclusters. Furthermore, the high resistivity of the preferred substrates reduces electrical losses.

Thus, the magnetic materials of the present invention are useful for application in, for example, magnetic sensors, and as cores for nanofluxgates or nanosolenoids.

Preferred magnetic materials for use as magnetic sensors and as cores for nanofluxgates have relatively low coercive fields. In some preferred embodiments, the magnetic materials have a magnetic coercivity at 5 K below about 100 Oe, more preferably below about 50 Oe, more preferably below about 20 Oe, more preferably below about 10 Oe, more preferably below about 5 Oe, more preferably below about 1 Oe, more preferably about 0.1 Oe.

Those magnetic materials of the invention that have relatively high coercive fields are useful for application as a hard magnet for nano-electromechanical systems. Preferably, the magnetic materials have a magnetic coercivity above about 200 Oe at 5 K. In other preferred embodiments, the magnetic materials have a magnetic coercivity at least about 200 Oe at 5 K.

Accordingly, the invention also contemplates devices comprising a magnetic material of the invention.

More specifically, in another aspect, the present invention provides a magneto-electric device comprising a magnetic material of the invention. In some embodiments, the magneto-electric device is a magnetic actuator. In other embodiments, the magneto-electric device is a magnetoresistor. In other embodiments, the magneto-electric device is a magnetic sensor.

In some preferred embodiments, the magneto-electric device is a magneto-resistive sensor component. In other preferred embodiments, the magneto-electric device is a nanofluxgate.

In some embodiments, the magneto-electric device is incorporated into a micro- or nano-electro mechanical system.

The methods of the present invention permit the fabrication of magnetic materials and magneto-electric devices using insulating substrates and with relatively low annealing temperatures and/or short annealing times. These features are particularly advantageous for the incorporation of the magnetic materials and magneto-electric devices into electronic circuits and the incorporation of the methods into the manufacture of electronic integrated circuits.

Accordingly, in another aspect, the present invention provides a method for manufacturing an electronic integrated circuit that comprises producing a magnetic material by the method of the invention.

In another aspect, the present invention provides an electronic circuit comprising a magnetic material of the invention. In another aspect, the present invention provides an electronic circuit comprising a magneto-electric device of the invention. In some preferred embodiments, the magneto-electric device is a magnetic sensor.

In some embodiments, the magneto-electric device is incorporated into a micro- or nano-electronic integrated circuit. In some preferred embodiments, the magneto-electric device is a magnetic sensor.

In another aspect, the present invention provides a magnetic material of the invention for use in a magneto-electronic device. In some preferred embodiments, the magnetic material is prepared substantially according to the method of the invention.

Magnetic Sensing

The magnetic materials of the present invention are magnetoresistive. In some embodiments, the magnetic materials of the present invention have a large positive magnetoresistance ratio.

Generally, any magnetic material is magnetoresistive because of the Hall effect, which results in the magnetic field increasing the path of the electrons in the material and thus "virtually" increasing the resistance. Most magnetic materials also exhibit magnetoresistance due to the restriction of the material in a magnetic field, but the change in the resistance is generally low. Some materials exhibit large to very large magneto-resistance, so-called giant magnetoresistance (GMR), colossal magnetoresistance (CMR), tunneling magnetoresistance (TMR), and magnetoresistive switch (MRS) effect.

When a magnetoresistor is placed in a magnetic field, its resistivity varies with the magnitude of the field. Thus, magnetoresistors can be used as magnetic sensing devices. Magnetic sensing devices based on magnetoresistors are easy to implement but are typically not highly sensitive.

It is possible to detect small variations of resistance by placing a variable resistance into a resistor bridge, using the Wheatstone bridge configuration. The variable resistance and another resistor in series are placed parallel to another pair of resistors so that the current flowing in each branch is the same. The difference between the potential at the middle of the two branches is directly proportional to the change of resistance of the variable resistance. This signal can then be amplified and displayed.

Example 2 describes the application of this principle using the magnetic materials of the present invention as a variable resistance.

Accordingly, magnetic sensors can be fabricated from the magnetic materials of this invention by the addition of other conventional components such as contacts, a power supply etc.

Fluxgate magnetometers measure the magnitude and direction of a constant or low frequency magnetic field. Fluxgate magnetometers allow the measurements of very small fields down to $10^{-2}$ nT.

A high permeability and low coercivity ferromagnetic material—the core—is excited from negative to positive magnetization saturation by a coil—the excitation coil—through which flows an alternating electrical current. The field resulting from the sum of both the excitation and the magnetization of the core is retrieved by another coil—the pick-up coil. If an external field is applied in the axis of the coil, the core will be driven more easily to one saturation and less easily to the other. This results in a de-synchronisation in the excitation signal and the signal measured by the pick-up coil. The difference in the phases of the signals depends on the amplitude and orientation of the external field. Various configurations—such as different core shape and materials and different signal analysis circuits—can be used to improve the performance of these sensors.

The development of fluxgates is directed primarily to miniaturization and increasing the frequency of the response. Fluxgate magnetometers are typically difficult to miniaturise because the magnetic noise dramatically increases with decreasing sensor length. The frequency of the response is limited by the resistivity of the core and the speed at which the core magnetization can be reversed. Certain magnetic materials of the present invention provide high resistivity, which reduces the eddy currents responsible for loss of sensitivity at high frequencies, and low magnetization pinning—each nanocluster acts as an independent magnetic domain—which allows fast saturation to saturation oscillations.

FIG. 1 shows one embodiment of a fluxgate magnetometer (40) using two parallel cores formed by two domains of a magnetic material of the present invention (45), which comprises ferromagnetic nanoclusters, formed in a silicon dioxide substrate (10) on a silicon support (30). The fluxgate magnetometer (40) includes two excitation coils with antiparallel synchronous signal, connected to an AC supply (50), that are wound over the cores and one pick-up coil, which is connected to a detector (55) to detect the 2f signal, wound over both excitation coils.

The magnetic materials of the present invention may be hard magnets. For example, those magnetic materials comprising iron/cobalt or samarium/cobalt nanoclusters show relatively high coercivities. Such materials could be used as hard magnets for micro- or nano-mechanical apparatus. Advantageously, the present invention permits the fabrication of hard magnetic materials with very small dimensions. The magnetic materials of the present invention could be used, therefore, as micro- or nano-scale magnetic actuators, for example in alternating current driven motors.

In addition, the current-driven magnetization of the hard magnetic materials could be useful in the fabrication of micro- or nano-scale components able to act as solenoids. The magnetization of such nanosolenoids can be flipped by reversing the voltage applied to the magnetic material.

Figure 2:
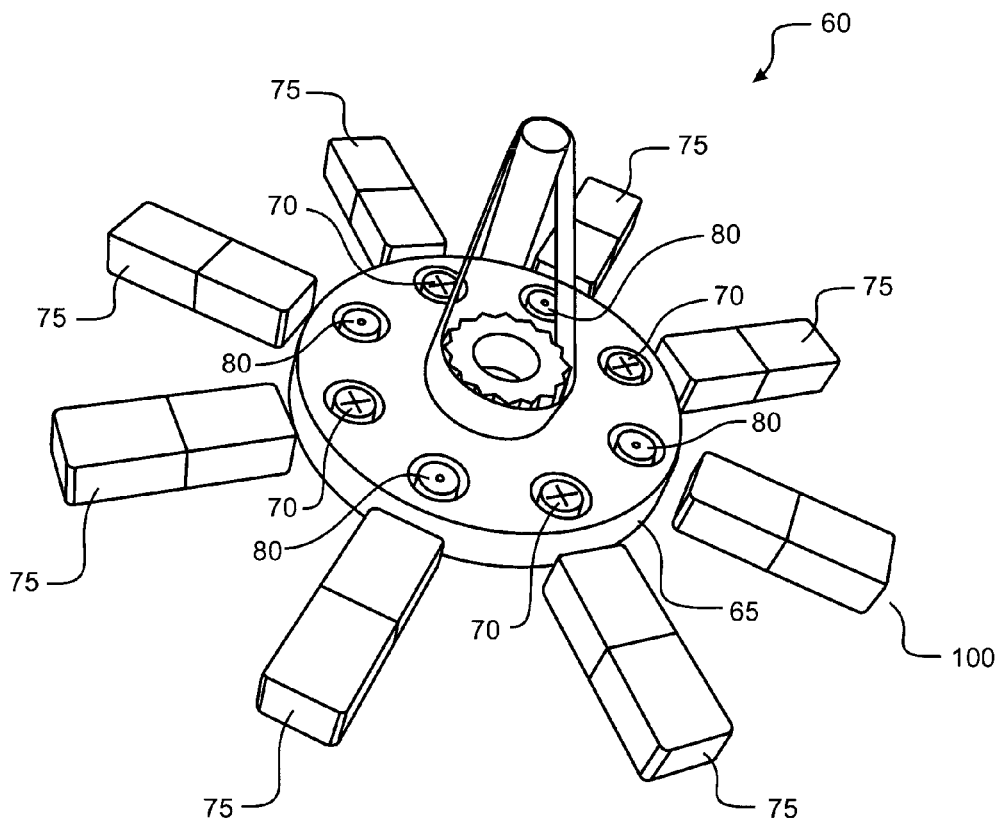
FIG. 2 is a schematic diagram of one embodiment of a nanostructured motor.

FIG. 2 shows one embodiment of a microelectrical mechanical system (MEMS) that is a nano-structured motor (60) in which the rotor (65) comprises several domains of a hard magnetic material of the present invention (70) with the same magnetic orientation and several domains of a hard magnetic material of the present invention (80) with the opposite magnetic orientation. Applying alternating magnetic fields around the rotor by flipping the magnetization of the nanosolenoids (75) with alternating current will apply a torque to the rotor (65), creating motion. The device shown in FIG. 2 could be readily adapted for use as a generator or alternator.

The following non-limiting examples are provided to illustrate the present invention and in no way limit the scope thereof.

EXAMPLES

Example 1

Magnetic Nanocluster Formation in Silicon Dioxide

Magnetic materials, with various nanocluster sizes and distributions, were obtained using the configurations listed below:

the substrates were 400 and 500 nm layers of silicon dioxide on silicon;

7.5 keV and 15 keV $^{56}$Fe$^+$ ions were implanted with a current density less than 10 µA/cm$^2$ under ultra high vacuum conditions at room temperature with ion fluences of $5\times10^{15}$, $1\times10^{16}$, $5\times10^{16}$, and $1\times10^{17}$ ions/cm$^2$; and the implanted samples were annealed with an electron beam under ultra high vacuum ($10^{-7}$ mbar) at 600° C., 800° C. or 1000° C.

The peak temperature during the electron beam annealing was held for: 0; 15; 30; 60; 300; 900; 1800; 3600; 7200; or 10800 seconds.

The temperature gradient during the electron beam annealing heating was +5° C./s to +20° C./s.

The temperature gradient during the cooling following the electron beam annealing was −5° C./s to −20° C./s.

The properties of the magnetic materials appeared to be independent of the temperature gradients during heating and cooling within these ranges.

The properties of the magnetic materials showed no significant differences for implantation ion fluences of $5\times10^{15}$, $1\times10^{16}$, or $5\times10^{16}$ ions/cm$^2$. A fluence of $1\times10^{17}$ ions/cm$^2$ resulted in the formation of larger nanoclusters, with diameters of around 80 nm, which exhibited hexagonal shapes. The relatively higher concentration of iron implanted at that fluence leads to more rapidly aggregated nanoclusters and also allows the formation of iron silicides.

Figure 3:
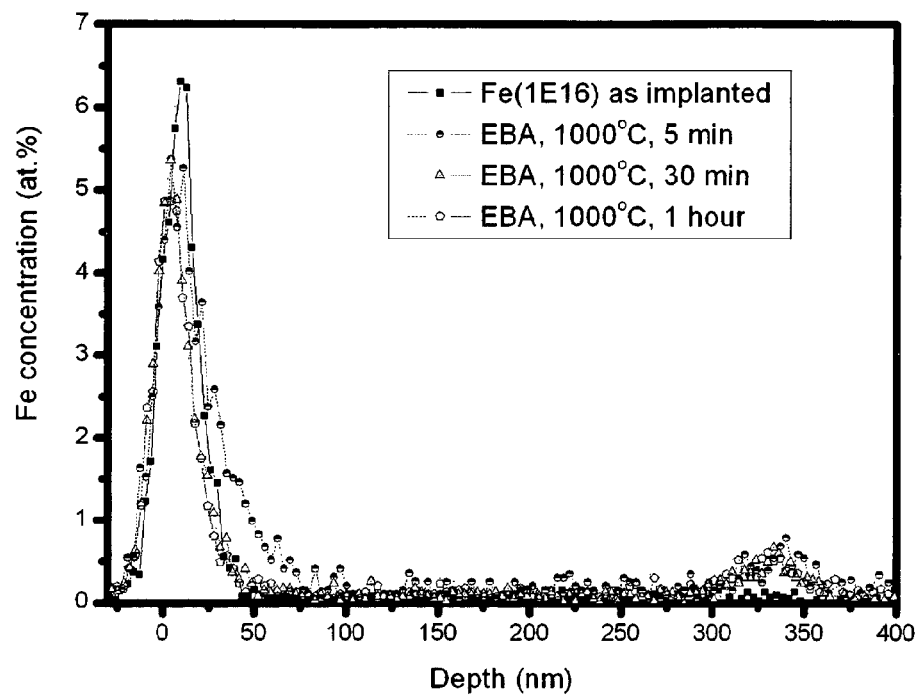
FIG. 3 shows the depth concentration profile of iron in a silicon dioxide thin film before and after annealing.
Figure 4:
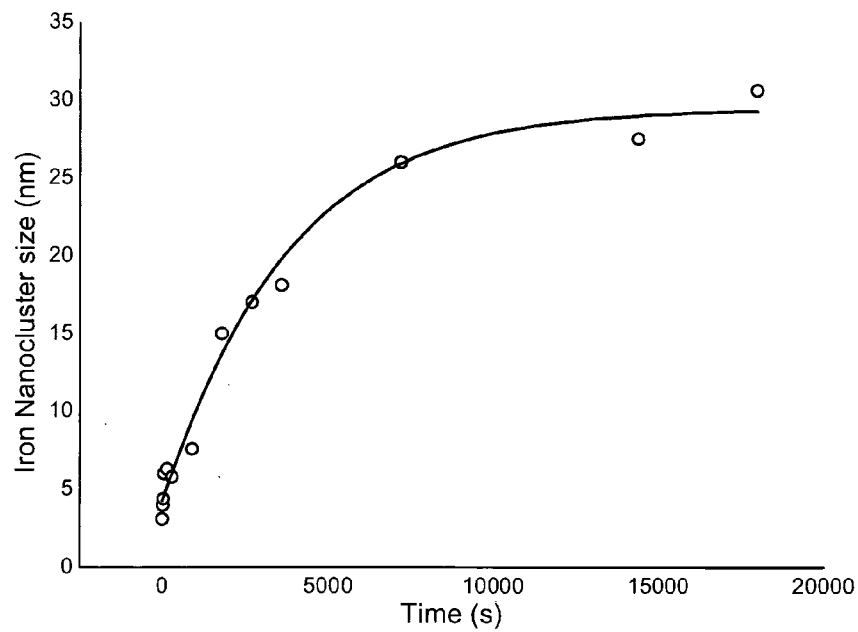
FIG. 4 is a plot of the nanocluster size, measured by atomic force microscopy at the surface, of iron nanoclusters in a silicon dioxide thin film as a function of the annealing time.
Figure 5:
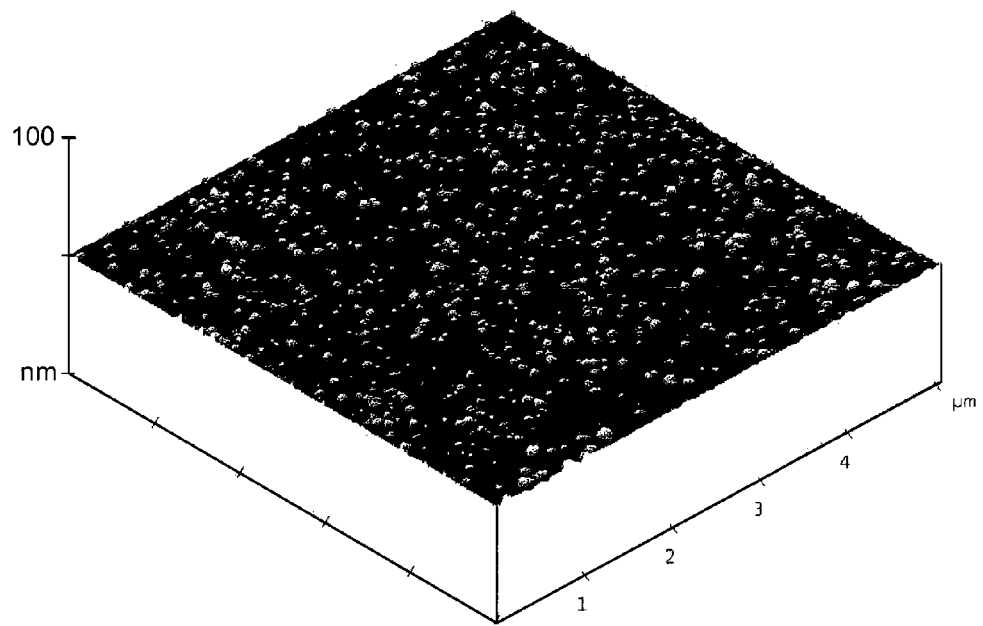
FIG. 5 is an atomic force microscope image of the surface of a magnetic material formed by implanting $^{56}Fe^+$ ions into a silicon dioxide thin film and annealing.

Analysis of the magnetic material produced with an implantation ion fluence of $1\times10^{16}$ ions/cm$^2$ by Rutherford backscattering spectrometry (RBS) showed that the implanted iron atoms are at the near-surface region of the samples annealed for a few seconds and start to aggregate after that time (FIG. 3). The variation of the nanocluster size as a function of the annealing time at 1000° C. is shown in FIG. 4. Atomic force microscopy (AFM) (FIG. 5) and transmission electron microscopy (TEM) (FIGS. 6 and 7) images show that 5-10 nm diameter Fe-rich spherical nanoclusters were present in the samples after annealing for 15 seconds at 1000° C.

Figure 6:
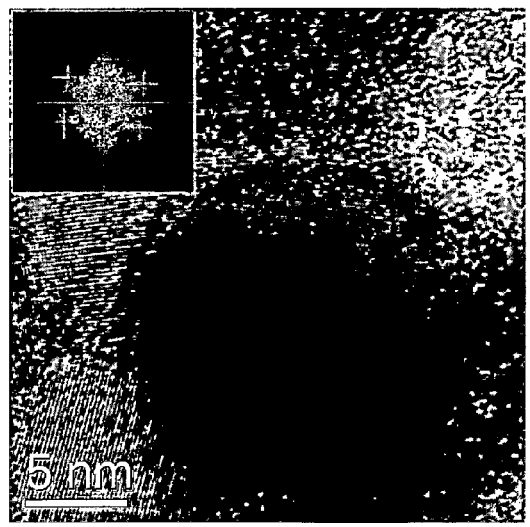
FIG. 6 is a high resolution transmission electron microscopy image of an iron nanocluster on the surface of a silicon dioxide thin film, with the inset showing the crystalline state of the nanocluster.
Figure 7:
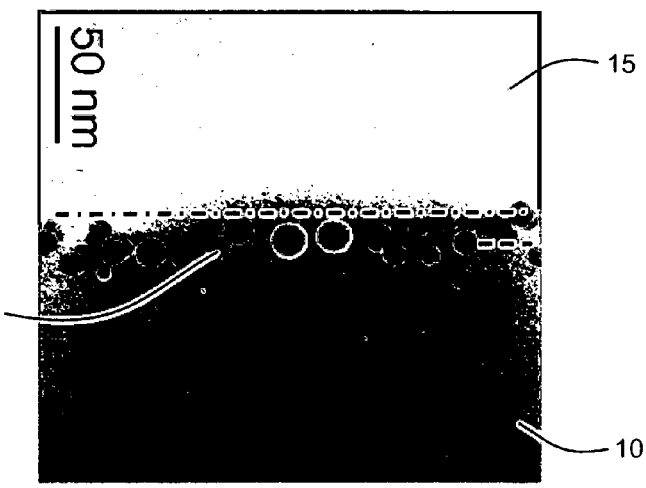
FIG. 7 is a transmission electron microscopy image of a magnetic material formed by implanting $^{56}Fe^+$ ions into a silicon dioxide thin film and annealing.

The high resolution transmission electron microscopy image in FIG. 6 shows an iron nanocluster on the surface of the silicon dioxide thin film. The inset to FIG. 6 shows the crystalline state of the nanocluster. The transmission electron microscopy image in FIG. 7 shows bands (dashed line) of iron nanoclusters (5) in the silicon dioxide thin film (10). The dotted and dashed line is the interface between the silicon dioxide thin film (10) and the epoxy matrix (15).

Figure 8:
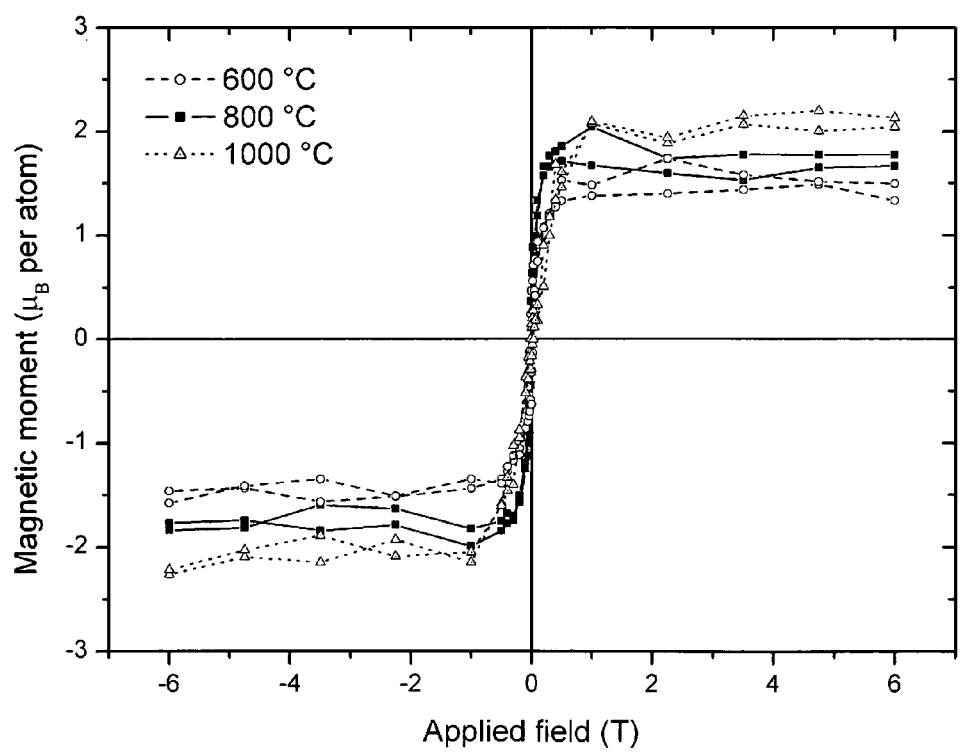
FIG. 8 shows the magnetization hysteresis loops, at room temperature, of magnetic materials formed by implanting $^{56}Fe^+$ ions into a silicon dioxide thin film and annealing as a function of the annealing temperature.

The magnetic and electron transport properties of the magnetic materials, which comprised iron nanoclusters in silicon dioxide, were investigated using superconducting quantum interference device (SQUID) magnetometry and four point resistance measurements with physical properties measurement system (PPMS). The observed magnetic moments per atom at room temperature (300 K) for materials annealed with the electron beam for one hour at 600° C., 800° C. and 1000° C. are shown in FIG. 8.

Measuring the resistance in a variable magnetic field showed that the resistance of the magnetic materials increased greatly with increasing magnetic field. The magnetoresistance (MR) ratio was measured with a field perpendicular to the surface of the magnetic materials. The amplitude of the changes was up to 20% at 300 K and 90% at 100K for an applied field of 4 Tesla, and 40% at 300 K for an applied field of 8 Tesla. The non-linear shape of the curves, particularly at 100K, was not consistent with the Hall effect alone. Without wishing to be bound by theory, it is thought that the positive room temperature magnetoresistance behaviour is likely to originate from a combination of tunneling magnetoresistance and other geometry related magnetoresistance phenomena.

The measurements showed that different magnetic behaviour resulted from the different annealing conditions, which is attributed to the difference in the size of the magnetic nanoclusters formed under the different electron beam annealing conditions. For example, the magnetic materials obtained after annealing with the electron beam for one hour at 600° C. or 800° C. were superparamagnetic, while the materials obtained after annealing for one hour at 1000° C. were ferromagnetic with coercive fields below about 50 Oe or 0.005 T (at 5 K).

The above methods were repeated using other implanted ions. Similar magnetic and structural results were obtained by implanting nickel or cobalt ions at similar fluences and energies into silicon dioxide then electron beam annealing.

Similar magnetic and structural results were also obtained by implanting nickel or cobalt ions at similar fluences and energies into substrates comprising silicon nitride on silicon then electron beam annealing.

Similar magnetic and structural results were also obtained by implanting iron, nickel or cobalt ions at similar fluences and energies into aluminium oxide substrates then electron beam annealing.

Higher coercive fields were obtained for magnetic materials comprising Fe/Co nanoclusters (200 Oe or 0.02 T; 5 K) and Sm/Co nanoclusters (500 Oe or 0.05 T; 5 K). These magnetic materials were fabricated by implanting consecutively iron ($8.5\times10^{16}$ ions/cm$^2$ at 15 keV) and cobalt ($1\times10^{16}$ ions/cm$^2$ at 15 keV) ions or samarium ($1\times10^{16}$ ions/cm$^2$ at 20 keV) and cobalt ($5\times10^{16}$ ions/cm$^2$ at 15 keV) ions at similar fluences and energies into silicon dioxide then electron beam annealing (3600 s at 1000° C. for Fe/Co; 1800 s at 940° C. for Sm/Co). The pressure was less than $2\times10^{-7}$ mbar during implantation and annealing and the samples were removed from the vacuum between the two implantation steps.

Similar results were obtained for magnetic materials obtained by implanting consecutively iron and cobalt ions or samarium and cobalt ions at similar fluences and energies into substrates comprising silicon nitride on silicon then electron beam annealing.

Example 2

Magnetoresistive Sensor Comprising Iron Nanoclusters in Silicon Dioxide

A magnetoresistive sensor was fabricated including one Wheatstone bridge with an operational amplifier; all powered by a 5V stabilized power supply.

A magnetic material comprising iron nanoclusters uniformly distributed in a 10 mm×4 mm silicon dioxide on silicon substrate was fabricated using the method of Example 1. The iron atoms were implanted with an energy of 15 keV and a fluence of $1\times10^{16}$ ions/cm$^2$, followed by electron beam annealing at 1000° C. for one hour.

Electrical contacts were fabricated by depositing a 2 nm thick titanium layer followed by a 20 nm thick aluminium layer on both ends of the material using ion beam sputtering. The titanium layer was used to improve the adhesion and electrical contact between the aluminium and the magnetic material. To improve the electrical conductivity between the magnetic material and the contacts, they were annealed at about 300° C. for 30 minutes.

The fixed resistance of the resistor bridge was selected following measurements of the resistance of the magnetic material. The magnetic material was then integrated to the electrical board as the variable resistance, using conductive silver paint for electrical contact. A potentiometer was used on the other branch of the bridge to balance the voltage at 2.5 V when the sensor was at rest.

The magnetic material was subjected to different applied magnetic fields, using different commercial magnetic probes for calibration. The magnetic material was a very efficient magnetic sensor across a wide range of external fields (0.05 T to 7 T). The magnetic material was also reasonably stable at temperatures in the range −70° C. to +40° C.

Without wishing to be bound by theory, the sensor's efficiency is thought to be due to the small coercive field and the significant magnetoresistance ratio observed for the magnetic material.

Figure 9:
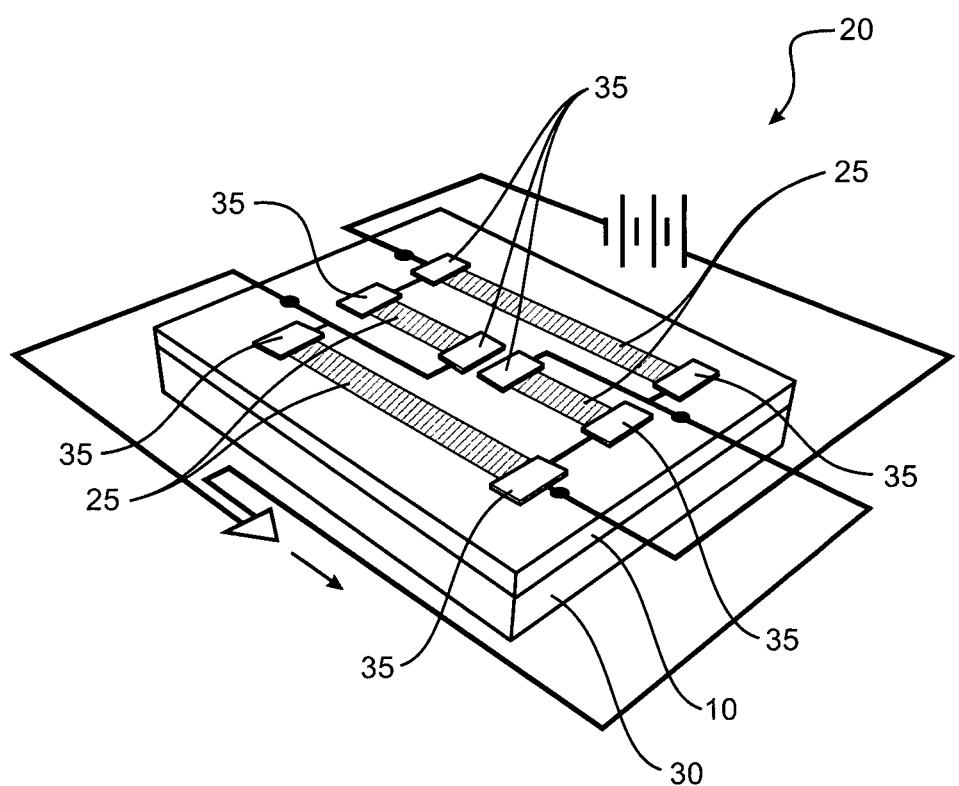
FIG. 9 is a schematic diagram of one embodiment of a magnetoresistive sensor.

FIG. 9 depicts one embodiment of a more sophisticated apparatus (20) for use as a magneto-resistive sensor that includes several domains of a magnetic material of the present invention (25), which has anisotropic magnetoresistance, formed, in a full bridge configuration, in a silicon dioxide substrate (10) on a silicon support (30) with electrical contacts (35) formed by metallization.

It is not the intention to limit the scope of the invention to the above mentioned examples only. As would be appreciated by a skilled person in the art, many variations are possible without departing from the scope of the invention as set out in the accompanying claims.

The invention claimed is:

1. A method for producing a magnetic material, the method comprising the steps of:
    (a) providing a substrate;
    (b) implanting low energy magnetic ions into the substrate; and
    (c) in a chamber at less than atmospheric pressure, heating the implanted substrate with a charged particle beam to a peak temperature, optionally holding the peak temperature for a predetermined time, and decreasing the temperature of the implanted substrate to provide the magnetic material;
    wherein, during step (b), two or more ions are sequentially implanted.

2. A method as claimed in claim 1 wherein the substrate is an insulator.

3. A method as claimed in claim 1 wherein the substrate is an insulating oxide or nitride.

4. A method as claimed in claim 1 wherein the substrate is selected from the group consisting of: silicon dioxide; aluminium oxide; and silicon nitride.

5. A method as claimed in claim 1 wherein the magnetic ions are selected from the group consisting of: iron; cobalt; nickel; samarium; neodymium; and chromium.

6. A method as claimed in claim 1 wherein the ions are iron and cobalt or samarium and cobalt.

7. A method as claimed in claim 1 wherein, during step (b), the magnetic ions penetrate the substrate to a depth up to about 100 nm.

8. A method as claimed in claim 1 wherein the magnetic ions are implanted with a fluence between about $1.0\times10^{15}$ ions/cm$^2$ and about $5.0\times10^{16}$ ions/cm$^2$.

9. A method as claimed in claim 1 wherein the charged particle beam is an electron beam.

10. A method as claimed in claim 1 wherein, during step (c), the implanted ions aggregate to form magnetic nanoclusters.

11. A method as claimed in claim 1 for producing a magnetic material comprising magnetic nanoclusters in an electrically insulating substrate, the method comprising the steps of:
- (a) providing the electrically insulating substrate;
- (b) implanting a first species of low energy ions, selected from the group consisting of: iron; cobalt; nickel; samarium; neodymium; and chromium ions, to a depth between about 5 nm and about 100 nm into the substrate; and
- implanting one or more species of low energy ions, selected from a second group consisting of: iron; cobalt; nickel; samarium; neodymium; chromium; oxygen; and boron ions, to a depth between about 5 nm and about 100 nm into the substrate, wherein the species selected from the second group are different from the first species; and
- (c) in a chamber at a pressure less than about $1 \times 10^{-6}$ mbar, heating the implanted substrate with an electron beam to a peak temperature between about 500° C. and about 1400° C., optionally holding the peak temperature for a predetermined time, such that the implanted ions aggregate to form magnetic nanoclusters, and decreasing the temperature of the implanted substrate, to provide the magnetic material.

12. A method as claimed in claim 1 for producing a magnetic material comprising magnetic nanoclusters in an electrically insulating substrate, the method comprising the steps of:
- (a) providing the electrically insulating substrate;
- (b) implanting a first species of low energy ions, selected from the group consisting of: iron; cobalt; nickel; samarium; neodymium; and chromium ions, to a depth between about 5 nm and about 100 nm into the substrate; and
- implanting one or more species of low energy ions, selected from a second group consisting of: iron; cobalt; nickel; samarium; neodymium; chromium; oxygen; and boron ions, to a depth between about 5 nm and about 100 nm into the substrate, wherein the species selected from the second group are different from the first species; and
- (c) in a chamber at a pressure less than about $1 \times 10^{-6}$ mbar, heating the implanted substrate with an electron beam to a peak temperature and for a time effective to aggregate the implanted ions to form magnetic nanoclusters, and decreasing the temperature of the implanted substrate, to provide the magnetic material.

13. A magneto-electric device comprising a magnetic material, wherein the magnetic material is produced by a method as claimed in claim 1.

* * * * *